(12) United States Patent
Burkett et al.

(10) Patent No.: US 10,520,693 B2
(45) Date of Patent: Dec. 31, 2019

(54) PRE-MOUNTED FIBER OPTIC DISTRIBUTION CABINET ASSEMBLY

(71) Applicant: CORNING RESEARCH & DEVELOPMENT CORPORATION, Corning, NY (US)

(72) Inventors: Alan Duncan Burkett, Bedford, TX (US); Joseph Ronald Herridge, North Richland Hills, TX (US); Trampus Lee Landrum, Hickory, NC (US); Fabiola Patricia Villanueva Tavares, Tamaulipas (MX)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 15/428,561

(22) Filed: Feb. 9, 2017

(65) Prior Publication Data

US 2018/0224618 A1    Aug. 9, 2018

(51) Int. Cl.
*G02B 6/44* (2006.01)
*G02B 6/38* (2006.01)
*H04Q 1/02* (2006.01)
*H05K 7/18* (2006.01)

(52) U.S. Cl.
CPC .......... *G02B 6/445* (2013.01); *G02B 6/3897* (2013.01); *G02B 6/4452* (2013.01); *H04Q 1/025* (2013.01); *H04Q 1/09* (2013.01); *H05K 7/183* (2013.01); *H05K 7/186* (2013.01)

(58) Field of Classification Search
CPC ...... G02B 6/132; G02B 6/445; G02B 6/3897; G02B 6/4452; H04Q 1/025; H04Q 1/09; H05K 7/183; H05K 7/186; H01S 5/026

USPC ................................................... 385/135–139
See application file for complete search history.

(56) References Cited

U.S. PATENT DOCUMENTS

| | | | |
|---|---|---|---|
| 6,039,414 A * | 3/2000 | Melane | H05K 7/18 220/812 |
| 6,792,191 B1 | 9/2004 | Clapp, Jr. et al. | |
| 7,457,503 B2 | 11/2008 | Solheid et al. | |
| 8,019,192 B2 | 9/2011 | Puetz et al. | |
| 8,238,709 B2 | 8/2012 | Solheid et al. | |

(Continued)

OTHER PUBLICATIONS

International Search Report and Written Opinion PCT/US2018/017072 dated Apr. 26, 2018.

*Primary Examiner* — Michael P Mooney
(74) *Attorney, Agent, or Firm* — Grant A. Gildehaus

(57) ABSTRACT

A pre-mounted fiber optic distribution cabinet assembly is disclosed. The pre-mounted fiber optic distribution cabinet assembly includes a fiber optic distribution cabinet with an enclosure having an interior configured to house fiber optic components. The fiber optic distribution cabinet is sealed to protect against the ingress of solid foreign objects and liquids into the interior. A frame attaches to the exterior of the enclosure so that the fiber optic distribution cabinet is mounted in the frame when shipped to an installation location. The fiber optic distribution cabinet is configured to be mounted at the installation location via the frame. A stabilizer attached to the fiber optic distribution cabinet provides balancing support to the fiber optic distribution cabinet to maintain the fiber optic distribution cabinet in a generally upright orientation with the frame attached to the fiber optic distribution cabinet.

9 Claims, 4 Drawing Sheets

(56) References Cited

U.S. PATENT DOCUMENTS

| | | |
|---|---|---|
| 2005/0002633 A1 | 1/2005 | Solheid et al. |
| 2005/0196126 A1 | 9/2005 | Sugiyama |
| 2005/0275319 A1 | 12/2005 | Wittmeier et al. |
| 2006/0008231 A1 | 1/2006 | Reagan et al. |
| 2006/0158866 A1 | 7/2006 | Peterson et al. |
| 2016/0037919 A1* | 2/2016 | Griffith ................ H05K 5/0208 312/286 |

* cited by examiner

PRE-MOUNTED FIBER OPTIC DISTRIBUTION CABINET ASSEMBLY

FIELD

The disclosure relates generally to fiber optic distribution cabinet assemblies, including assemblies with a fiber optic distribution cabinet pre-mounted in a communication frame or rack during manufacture and assembly, and shipped to an installation location in that state so that the fiber optic distribution cabinet assembly can be mounted to the installation location via the communication frame or rack.

BACKGROUND

As a result of the ever-increasing demand for broadband communications involving voice, video and data transmission, telecommunication and cable media service providers and/or operators have increasingly relied on fiber optics to provide large bandwidth telecommunication service to their subscribers. Fiber optic solutions have become the main part of telecommunication networks. Optical cables can transmit voice, data and video signals over very long distances at very high speed. Because of this, developments in fiber optic telecommunication networks have consistently focused on extending the optical fiber closer to the subscriber to the point that currently the subscriber can be connected directly to the fiber optic network through FTTx (fiber to the specific location "x") technology, including FTTH (fiber-to-the-home) technology, which provides an "all optical" communication network right to the subscribers at their homes. The subscriber premises may be a single-family dwelling or an apartment or portion of a multiple dwelling unit ("MDU").

With regard to MDUs, fiber optic communication service is provided by a fiber optic distribution cable connected to the fiber optic network and routed into the MDU. In the MDU, the fiber optic distribution cable connects to a main distribution point, typically a fiber optic distribution cabinet located in a basement or lower level of the MDU. The fiber distribution cabinet is a type of a fiber distribution hub ("FDH") and may be referred to as such, although not all FDHs may be structured as enclosed cabinets. Riser cables extend from the fiber optic distribution cabinet to the different levels of the MDU and connect to the subscribers on the different levels to provide communication service to the subscribers. Larger MDUs, a high rise in a major metropolitan area, for example, may have many subscribers necessitating the use of either multiple fiber optic distribution cabinets or a larger fiber optic distribution cabinet with the ability to connect more subscribers. Installing, connecting and commissioning multiple fiber optic distribution cabinets will require a proportionate increase in the time and resources than would be necessary to install just one fiber optic distribution cabinet. However, as fiber optic distribution cabinets increase in size, they tend to require more labor, time and resources to manufacture, assemble, install and connect, particularly in indoor installation locations. Further, installation of such a large fiber optic distribution cabinet may involve the setting of the communication frame to the floor of the MDU level and the un-packaging and mounting of the fiber optic distribution cabinet in the communication frame. Given the relative weight of the fiber optic distribution cabinet, additional care must be used by the field technician to avoid any personal injuries from the fiber optic distribution cabinet falling or tipping over when being installed.

Consequently, there is an unresolved need for a large sized fiber optic distribution cabinet assembly that can be more cost effectively and more safely manufactured, assembled, shipped, installed and connected at the installation location, particularly large MDU installation locations.

No admission is made that any reference cited herein constitutes prior art. Applicant expressly reserves the right to challenge the accuracy and pertinence of any cited documents.

SUMMARY

One embodiment of the disclosure relates to a pre-mounted fiber optic distribution cabinet assembly comprising a fiber optic distribution cabinet, comprising an enclosure with an interior configured to house fiber optic components, and a door for access to the interior when the door is open, wherein the fiber optic distribution cabinet is sealed to protect against ingress of solid foreign objects and liquids into the interior when the door is closed. The pre-mounted fiber optic distribution cabinet assembly also comprises a frame attached to an exterior of the enclosure, wherein the fiber optic distribution cabinet is shipped to an installation location mounted in the frame. The pre-mounted fiber optic distribution cabinet assembly also comprises a stabilizer attached to the fiber optic distribution cabinet, wherein the stabilizer provides balancing support to the fiber optic distribution cabinet to maintain the fiber optic distribution cabinet in a generally upright orientation with the fiber optic distribution cabinet mounted in the frame.

Another embodiment of the disclosure relates to a pre-mounted fiber optic distribution cabinet stabilizer comprising a structure configured to provide balancing support for a fiber optic distribution cabinet when the fiber optic distribution cabinet is pre-mounted in a frame. The pre-mounted fiber optic distribution cabinet stabilizer also comprises at least one fastener, wherein the at least one fastener attaches the structure to the fiber optic distribution cabinet, and wherein the structure maintains the fiber optic distribution cabinet in a generally upright orientation when the fiber optic distribution cabinet is pre-mounted in the frame.

Yet another embodiment of the disclosure relates to a method for supporting pre-mounted fiber optic distribution cabinet. The method comprises attaching a frame to an exterior of an enclosure of a fiber optic distribution cabinet, wherein the fiber optic distribution cabinet is mounted in the frame, and wherein the enclosure comprises an interior configured to house fiber optic components, and a door for access to the interior when the door is opened, and wherein the fiber optic distribution cabinet is sealed to protect against ingress of solid foreign objects and liquids into the interior when the door is closed; supporting by the frame the enclosure during manufacture of the fiber optic distribution cabinet; supporting by the frame the enclosure during shipment of the fiber optic distribution cabinet to an installation location, wherein the door is closed during shipment; attaching a stabilizer to the fiber optic distribution cabinet, wherein the stabilizer provides balancing support to the fiber optic distribution cabinet to orient the fiber optic distribution cabinet in a generally upright orientation with the fiber optic distribution cabinet mounted in the frame; and shipping to the installation location the fiber optic distribution cabinet mounted in the frame with the stabilizer attached to the fiber optic distribution cabinet.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

One embodiment of the disclosure relates to a pre-mounted fiber optic distribution cabinet assembly comprising a fiber optic distribution cabinet, comprising an enclosure with an interior configured to house fiber optic components, and a door for access to the interior when the door is open, wherein the fiber optic distribution cabinet is sealed to protect against ingress of solid foreign objects and liquids into the interior when the door is closed. The pre-mounted fiber optic distribution cabinet assembly also comprises a frame attached to an exterior of the enclosure, wherein the fiber optic distribution cabinet is mounted in the frame, and wherein the frame supports the enclosure during manufacture of the fiber optic distribution cabinet and shipment of the fiber optic distribution cabinet to an installation location, and wherein the fiber optic distribution cabinet is configured to be mounted at the installation location via the frame. The pre-mounted fiber optic distribution cabinet assembly also comprises a stabilizer attached to the fiber optic distribution cabinet, wherein the stabilizer provides balancing support to the fiber optic distribution cabinet to maintain the fiber optic distribution cabinet in a generally upright orientation with the fiber optic distribution cabinet mounted in the frame.

Figure 1:
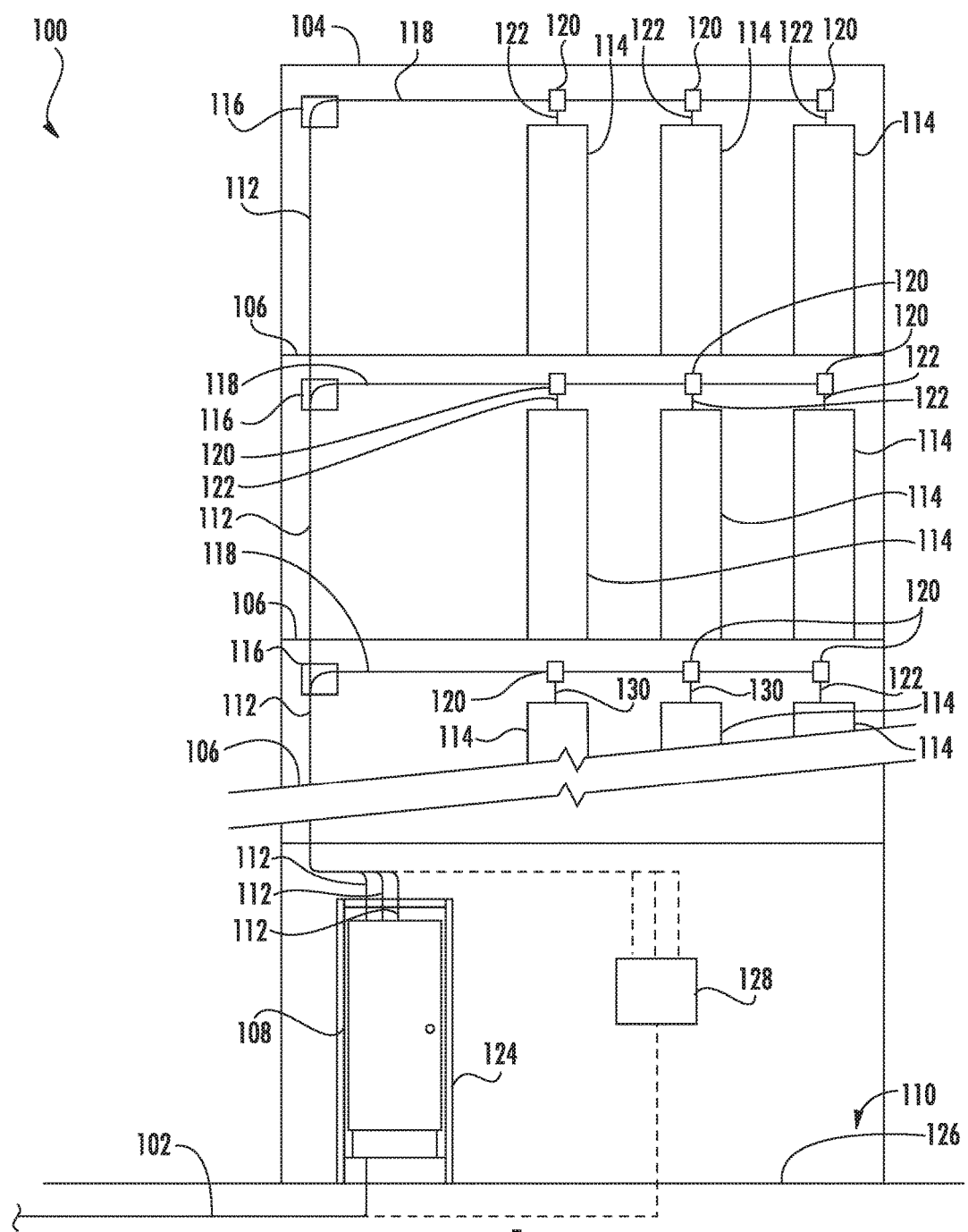
FIG. 1 schematically illustrates a multiple dwelling unit (MDU) with a fiber optic distribution cabinet and a fiber optic distribution cable and riser cables extended from the fiber optic distribution cabinet.

Referring to FIG. 1, there is shown a simplified schematic illustration of a portion of a fiber optic network 100. The fiber optic network 100 includes the fiber optic feeder cable 102 routed underground to a multiple dwelling unit (MDU) 104 having multiple floors or levels 106. The fiber optic feeder cable 102 connects to a fiber optic distribution cabinet 108 located in a lower level or basement 110 of the MDU 104. Riser cables 112 extend from the fiber optic distribution cabinet 108 to the multiple floors or levels 106 to provide optical service to the subscriber premises 114 located on the multiple floors or levels 106 in the MDU 104. At one or more of the floors 106, the riser cable 112 may have an access point 116 from which a tether cable 118 may optically connect the riser cable 112 to a terminal or drop box 120. The tether cable 118 may be a preconnectorized fiber optic drop cable. At the terminal or drop box 120, a preconnectorized fiber optic drop cable 122 may extend to individual subscriber premises 114 or a group of subscriber premises 114 to provide optical communication service.

In FIG. 1, the fiber optic distribution cabinet 108 is shown mounted in a frame 124, such as, for example, a 7 foot communication frame or rack. Typically, the frame 124 may first be mounted to the floor 126 of the basement or lower level 110 of the MDU 104, and the fiber optic distribution cabinet 108 then mounted in the frame 124. The fiber optic feeder cable 102 is connected to the fiber optic distribution cabinet 108, including with regard to any optical fiber connections. Riser cables 112 may also be connected to the fiber optic distribution cabinet 108, as appropriate, to effect optical communication service to the floors 116 of the MDU 104 and to the subscriber premises 114. Additionally, or alternatively, one or more wall-mounted fiber optic distribution cabinets 128 may be used, particularly if the number of subscriber premises 114 in the MDU 104 is small. In such case, frame 124 may not be necessary. In FIG. 1, the wall-mounted fiber optic distribution cabinet 128 is illustrated, but with the fiber optic distribution cable 102 and the riser cables 112 depicted in dotted lines to indicate wall-mounted fiber optic distribution cabinet 128 as a possible alternative to the fiber optic distribution cabinet 108. However, if the number of subscriber premises 114 is initially larger, or increases as other subscribers enter the MDU 104, multiple wall-mounted fiber optic distribution cabinets 128 may be required, resulting in additional cost and increasing the time necessary to install, connect and commission each additional wall-mounted fiber optic distribution cabinet 128.

It should be noted that, although FIG. 1 illustrates an MDU 104 installation, the fiber optic distribution cabinet 108 may also be utilized in other portions of a fiber optic network 100, such as, for example, a data center (not shown). However, in such case, the fiber optic distribution cabinet 108 is mounted in the data center in a similar manner as described above with respect to mounting the frame 124 to the floor and then mounting the fiber optic distribution cabinet 108 in the frame 124. In this regard, because the installation locations, e.g., the MDU 104 and the data center, are indoor installation locations, the fiber optic distribution cabinet 108 may typically be designed for indoor applications, in other words, having an enclosure that is rated for indoor use. Further, a wall-mounted fiber optic distribution cabinet 128 may be rated only for indoor installation.

Moreover, to facilitate safe handling and mounting in the MDU 104, the indoor fiber optic distribution cabinet 108 may have to be limited in size and weight. To achieve this, the fiber termination capacity of the indoor fiber optic distribution cabinet 108 may be limited to a certain maximum of terminations, such as 432 fiber terminations or 504 fiber terminations as non-limiting examples, to allow for the safe handling and mounting of the fiber optic distribution cabinet in the MDU 104. Efforts to develop an indoor fiber optic distribution cabinet having larger fiber termination capacity necessitated weight-reducing construction designs, including, utilizing an open framework support structure on which to mount the fiber optic components, instead of an enclosed cabinet. In this regard, due to the open framework, the support structure cannot be sealed and may not be protected against the ingress of dust or liquids during shipment and installation. As used herein, a terminal is a location for connecting one or more telecommunications lines (including, for example, copper telecommunications lines and optical telecommunications lines) with one or more other telecommunications lines (including, for example, copper telecommunications lines and optical telecommunications lines). As used herein, a termination is a telecommunications line having a coupler (such as, for example, an optical connector or electrical connector) for engaging one or more terminals.

Figure 2:
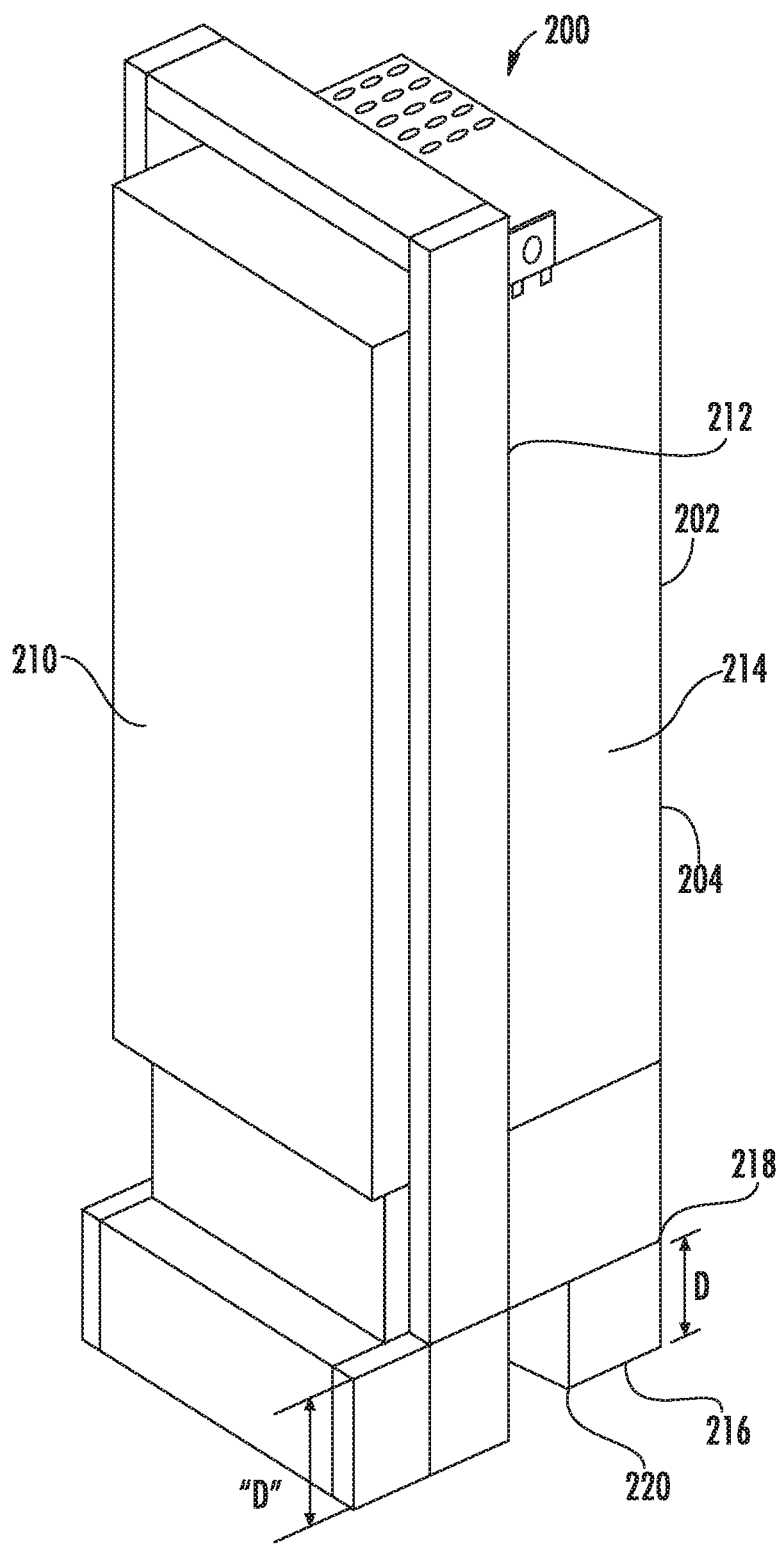
FIG. 2 is an exemplary embodiment of the fiber optic distribution assembly.
Figure 3:
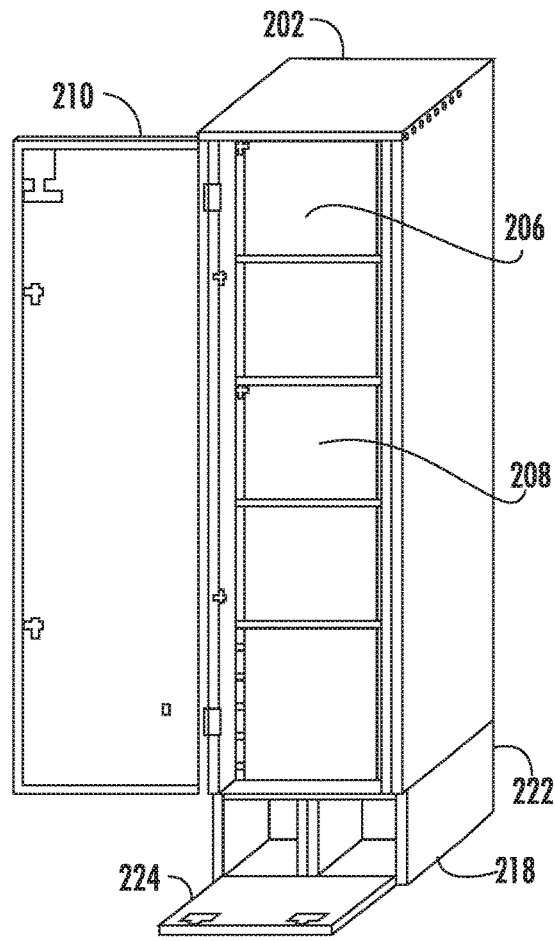
FIG. 3 is a front, perspective view of the fiber optic distribution cabinet of the fiber optic distribution assembly of FIG. 2.

Referring now to FIG. 2, there is shown an exemplary embodiment of a pre-mounted fiber optic distribution cabinet assembly 200. The pre-mounted fiber optic distribution cabinet assembly 200 has fiber optic distribution cabinet 202 with an enclosure 204 having an interior 206 configured to house fiber optic components 208 (as shown in FIG. 3). A door 210 may provide access to the interior 206 when the door 210 is open. The enclosure 204 protects against the ingress of solid foreign objects and liquids into the interior 206 when the door 210 is closed. A frame 212 may be attached to an exterior 214 of the enclosure 204 so that the fiber optic distribution cabinet 202 may be mounted in the frame 212. The frame 212 supports the enclosure 204, and, thereby, the fiber optic distribution cabinet 202 during manufacture, assembly and shipment of the fiber optic distribution cabinet 202 to an installation location. The fiber optic distribution cabinet 202 is configured to be mounted at the installation location via the frame 212.

A stabilizer 216 is attached to the fiber optic distribution cabinet 202 and provides balancing support to the fiber optic distribution cabinet 202 to maintain the fiber optic distribution cabinet 202 in a generally upright orientation when the frame 212 is attached to the enclosure 204 of the fiber optic distribution cabinet 202. The frame 212 may extend a distance "D" from the exterior 214 of the enclosure 204, particularly from a bottom 218 of the fiber optic distribution cabinet 202. The stabilizer 216 has a structure 220 configured to compensate for the distance "D" that the frame 212 extends from the exterior 214 of the enclosure 204 to maintain the fiber optic distribution cabinet 202 in the generally upright orientation. In this regard, the stabilizer 216 may be attached to a bottom 218 of the fiber optic distribution cabinet 202 to provide for the structure 220 to extend the distance "D".

Referring also now to FIG. 3, there is illustrated the fiber optic distribution cabinet 202 with the door 210 open. As discussed above, the enclosure protects against the ingress of solid foreign objects, including dust, and liquids, including water into the interior 206 when the door 210 is closed. In this regard, the fiber optic distribution cabinet 202 may comply with Telcordia standards including Telcordia GR-3123 standard for indoor installation or Telcordia GR-3125 standard for outdoor installations. In FIG. 3, the interior 206 of the enclosure 204 is shown with the fiber optic components 208 housed therein. The fiber optic components 208 may include fiber optic connection terminals, splitters, parking area, splice area and fiber management components. The interior 206 may house any number of fiber optic connection terminals including preferably up to at least about 576 fiber optic connection terminals, and, more preferably, up to at least about 864 fiber optic connection terminals. It should be understood that the number of fiber optic connection terminals discussed above should not be considered as limiting, and as such, higher capacity fiber optic distribution cabinets 202, providing for increased amount of fiber optic connection terminals, are also contemplated by the embodiments set forth herein. The fiber optic distribution cabinet 202 may also have a fiber optic distribution cable input compartment 222 with an access door 224. The fiber optic distribution cable input compartment 222 may be used to receive and terminate the fiber optic feeder cable 102 (not shown in FIG. 3). The bottom 218 of the fiber optic distribution cabinet 202 may be the bottom of the fiber optic distribution cable input compartment 222.

Figure 4:
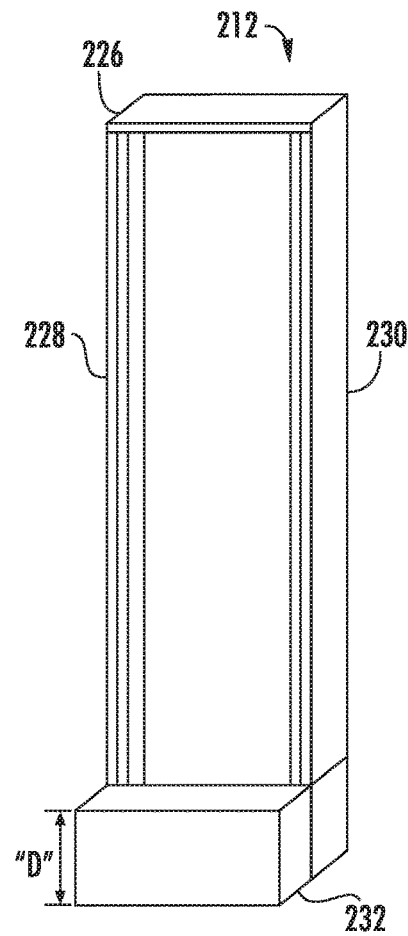
FIG. 4 is a front, perspective view of the frame of the fiber optic distribution assembly of FIG. 2.

Turning now to FIG. 4, the frame 212 is illustrated. The frame 212 may have a top member 226, first side member 228, second side member 230 and base 232. The top member 226, first side member 228, second side member 230 and base 232 may be metal, such as cold rolled steel as a non-limiting example, and connected by any suitable means, such as fasteners or welding as non-limiting examples. As discussed above, the frame 212 may be sized to extend the distance "D" from the exterior 214 of the enclosure 204, including with respect to the distribution cable input compartment 222 at the bottom 218 of the fiber optic distribution cabinet 202, shown in FIG. 2. Further, the base 232 may attach to the bottom 218 and be constructed as an open space to accept the fiber optic feeder cable 102 and provide an area for splicing the fiber optic feeder cable 102 to an input cable (not shown in FIG. 4) or direct passage for the fiber optic feeder cable 102 to the distribution cable input compartment 222. Accordingly, the distance "D" from the bottom 218 of the fiber optic distribution cabinet 202 may be a vertical dimension of the base 232.

Figure 5:
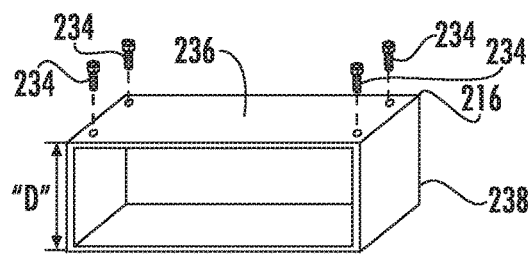
FIG. 5 is a front, perspective view of the stabilizer of the fiber optic distribution assembly of FIG. 2.

Referring to FIG. 5, a detail of one embodiment of the stabilizer 216 is shown. The stabilizer 216 may have a structure 220 configured to provide balancing support for the fiber optic distribution cabinet 202 when the fiber optic distribution cabinet 202 is pre-mounted in the frame 212. At least one fastener 234, such as a screw or rivet as non-limiting examples, may attach the structure 220 to the fiber optic distribution cabinet 202. The structure 220 may maintain the fiber optic distribution cabinet 202 in a generally upright orientation with the fiber optic distribution cabinet 202 pre-mounted in the frame 212. In this regard, the structure 220 may be a raised platform 236 and may be in the form of a rectangular, box-like shape 238. The structure 220 may be constructed of any suitable material, such as a metal as a non-limiting example.

Figure 6:
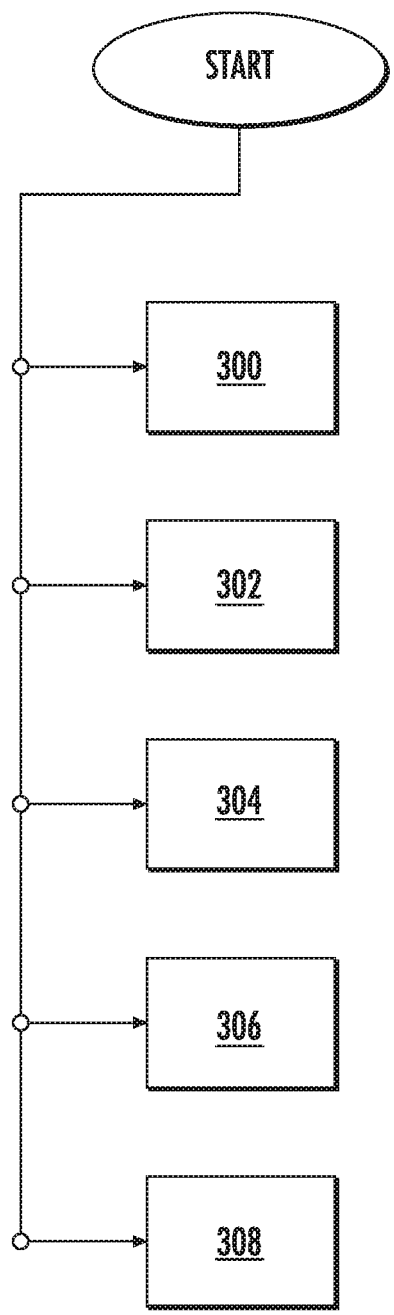
FIG. 6 is a flowchart diagram illustrating an exemplary process for supporting a fiber optic distribution cabinet.

FIG. 6 depicts a method for pre-mounting a fiber optic distribution cabinet 202 in a frame 212. The method may be implemented by attaching the frame 212 to the exterior 214 of the enclosure 204 (block 300), the enclosure 204 including an interior 206 configured to house fiber optic components 208, and a door 210 for access to the interior 206 when the door 210 is opened, the enclosure 204 protects against the ingress of solid foreign objects and water into the interior 206 when the door 210 is closed; supporting by the frame 212 the enclosure 204 during manufacture of the fiber optic distribution cabinet 202 (block 302); supporting by the frame 212 the enclosure 204 during shipment of the fiber optic distribution cabinet 202 to an installation location, the door being closed during shipment (block 304); attaching the stabilizer 216 to the fiber optic distribution cabinet 202, the stabilizer 216 providing balancing support to the fiber optic distribution cabinet 202 to orient the fiber optic distribution cabinet 202 in a generally upright alignment with the fiber optic distribution cabinet 202 mounted in the frame 212 (block 306); and shipping to the installation location the fiber optic distribution cabinet 202 mounted in the frame 212 with the stabilizer attached to the fiber optic distribution cabinet 202 (block 308). The fiber optic distribution cabinet 202 may be mounted in the frame 212 prior to shipment of the fiber optic distribution cabinet to the installation location. As such, the frame 212 may be used to support the fiber optic distribution cabinet 202 during shipment. Further, the stabilizer 216 may be attached to the bottom of the fiber optic distribution cabinet 202 prior to shipment. In some embodiments, the stabilizer 216 is a raised platform 236.

By attaching the frame 212 to the enclosure 204 to pre-mount the fiber optic distribution cabinet 202 to the frame 212, and attaching the stabilizer 216 to the fiber optic distribution cabinet 202 during the manufacture and assembly of the fiber optic distribution cabinet 202, the fiber optic distribution cabinet 202 does not have to be mounted to the frame 212 after assembly. Since a completely assembled fiber optic distribution cabinet 202 populated with fiber optic components 208 may weigh about 265 pounds, pre-mounting the fiber optic distribution cabinet 202 to the frame 212 during manufacture and assembly obviates the need to lift and manipulate such a weight at the installation site. Additionally, the pre-mounted fiber optic distribution cabinet assembly 200 may be shipped as a sealed structure reducing the chance of being affected by environmental elements and without requiring any special protective packaging. Further, due to the stabilizer 216, the pre-mounted fiber optic distribution cabinet assembly 200 may be safely shipped, reducing the chance of tipping over and possibly resulting in damage to the fiber optic distribution cabinet 202 and personal injury. In some embodiments, the fiber optic components 208 and at least 576 terminations are installed in the interior 206 of the enclosure 204 prior to mounting the frame 212 to a surface (such as a floor of a building) at an installation location. In yet other embodiments, the fiber optic components 208 and at least 864 terminations are installed in the interior 206 of the enclosure 204 prior to mounting the frame 212 to the surface at the installation location.

Because the fiber optic distribution cabinet 202 may be shipped sealed and, thereby, may be protected against the ingress of liquids, including water, for example, by a sprinkler system, and of dust, for example, from on-going installation or construction activities at the installation location. Moreover, installation of the fiber optic distribution cabinet 202 may be facilitated as the frame 212 does not have to be separately mounted first, and then fiber optic distribution cabinet 202 mounted in the frame 212 at the installation location, and also reducing labor requirements. Personnel at the installation location receive the fiber optic distribution cabinet assembly 200 with the fiber optic distribution cabinet assembly 202 pre-mounted in the frame 212, and, then, bolt the pre-mounted fiber optic distribution cabinet assembly 200 to the floor.

Continuing the discussion of weight touched on above, the pre-mounted fiber optic distribution cabinet assembly 200 including the fiber optic distribution cabinet 202 having at least 576 terminations may weigh up to about 265 pounds empty. The pre-mounted fiber optic distribution cabinet assembly 200 including the fiber optic distribution cabinet 202 mounted to the frame 212 and populated with fiber optic components 208 may weigh up to about 350 pounds. Additionally, a standard 7 foot communication frame 212 may add an additional 30 pounds, such that, the fiber optic distribution cabinet 202 mounted on a frame 212 and populated with fiber optic components 208 may weigh about 350 pounds. Therefore, while there is a benefit to shipping the fiber optic distribution cabinet 202 in this manner, the weight of the fiber optic distribution cabinet 202 pre-mounted in the frame 212 and populated with the fiber optic components 208 may result in difficult handling and controlling, and may expose shipping and installation personnel to personal injuries if the fiber optic distribution cabinet 202 should tip or fall over, as discussed above. Accordingly, the stabilizer 216 facilitates the shipping and installation of the fiber optic distribution cabinet 202 pre-mounted in the frame 212 by providing for more balance and support resulting in increased control and handling safety. In this regard, the stabilizer 216 maintains balance of the fiber optic distribution cabinet 202 weight to prevent strain on the cabinet mounting brackets and bolts, provides weight support for the fiber optic distribution cabinet 202 during manufacture to prevent the fiber optic distribution cabinet 202 from tipping over during manufacture, and assists with supporting the fiber optic distribution cabinet 202 weight and balance during unpacking and mounting the pre-mounted fiber optic distribution cabinet assembly 200 to the floor of the installation location.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A pre-mounted fiber optic distribution cabinet assembly, comprising:
    a fiber optic distribution cabinet comprising an enclosure with an exterior, an interior, and a door for access to the interior when the door is open, wherein the interior is configured to house fiber optic components and wherein the enclosure is sealed when the door is closed;
    a frame comprising a first side member, a second side member, and a base, wherein the first and second side members are attached to the exterior of the enclosure and the base is configured to be mounted to a floor of an installation location, wherein the frame extends a distance from a bottom surface of the exterior of the enclosure; and
    a stabilizer attached to the bottom surface of the exterior of the enclosure, wherein the stabilizer provides balancing support to the fiber optic distribution cabinet to maintain the fiber optic distribution cabinet in a generally upright orientation when the frame is mounted at the installation location.

2. The pre-mounted fiber optic distribution cabinet assembly of claim 1, wherein the stabilizer comprises a structure, and wherein the structure is configured to compensate for the distance the frame extends from the bottom surface of the exterior of the enclosure to maintain the fiber optic distribution cabinet in the generally upright orientation.

3. The pre-mounted fiber optic distribution cabinet assembly of claim 2, wherein a height of the structure is approximately equal to the distance the frame extends from the bottom surface of the exterior of the enclosure.

4. The pre-mounted fiber optic distribution cabinet assembly of claim 1, wherein the frame is adapted to mount the fiber optic distribution cabinet to a surface at the installation location without the need to attach the fiber optic distribution cabinet to the surface.

5. The pre-mounted fiber optic distribution cabinet assembly of claim 1, wherein the enclosure complies with Telcordia GR-3123 standard.

6. The pre-mounted fiber optic distribution cabinet assembly of claim 1, wherein the enclosure complies with Telcordia GR-3125 standard.

7. The pre-mounted fiber optic distribution cabinet assembly of claim 1, wherein the fiber optic components comprise at least about 576 fiber optic connection terminals.

8. The pre-mounted fiber optic distribution cabinet assembly of claim 1, wherein the fiber optic components comprise at least about 864 fiber optic connection terminals.

9. The pre-mounted fiber optic distribution cabinet assembly of claim 1, wherein the frame comprises a height of approximately 7 feet.

\* \* \* \* \*